(12) United States Patent
Martinez et al.

(10) Patent No.: US 6,276,676 B1
(45) Date of Patent: Aug. 21, 2001

(54) MANUAL REGISTRATION PIN ALIGNMENT SYSTEM

(75) Inventors: Henry R. Martinez, Torrance; Long D. Nguyen, Walnut, both of CA (US)

(73) Assignee: Excellon Automation Company, Torrance, CA (US)

(*) Notice: Subject to any disclaimer, the term of this patent is extended or adjusted under 35 U.S.C. 154(b) by 0 days.

(21) Appl. No.: 09/364,429

(22) Filed: Jul. 30, 1999

(51) Int. Cl.$^7$ ...................................................... B23Q 3/00
(52) U.S. Cl. ........................... 269/305; 269/305; 269/99; 269/41; 269/903
(58) Field of Search ..................... 269/305, 303, 269/903, 312, 314, 99, 41, 47, 52

(56) References Cited

U.S. PATENT DOCUMENTS

| | | |
|---|---|---|
| 4,280,775 | 7/1981 | Wood . |
| 4,409,860 * | 10/1983 | Moriyama et al. ..................... 269/60 |
| 4,486,128 | 12/1984 | Baker . |
| 4,520,551 | 6/1985 | Imhof . |
| 4,596,067 | 6/1986 | Raiteri . |
| 4,596,500 | 6/1986 | Raiteri . |
| 4,790,694 | 12/1988 | Wilent . |
| 4,865,494 | 9/1989 | Gudow . |
| 4,896,869 * | 1/1990 | Takekoshi .............................. 269/60 |
| 4,948,108 * | 8/1990 | Sullivan ................................ 269/903 |
| 5,021,018 | 6/1991 | Duback . |
| 5,036,574 | 8/1991 | Kakimoto . |
| 5,067,648 * | 11/1991 | Cascini .................................. 269/903 |
| 5,087,156 | 2/1992 | Kanaya . |
| 5,092,715 | 3/1992 | Theret . |
| 5,094,574 | 3/1992 | Nishigai . |
| 5,111,406 | 5/1992 | Zachman . |
| 5,123,789 | 6/1992 | Ohtani . |
| 5,154,546 | 10/1992 | Newmann . |
| 5,181,809 | 1/1993 | Martin . |
| 5,230,685 | 7/1993 | Christen . |
| 5,246,316 | 9/1993 | Smith . |
| 5,263,632 * | 11/1993 | Zadrick et al. ....................... 269/903 |
| 5,347,462 | 9/1994 | Okuda . |
| 5,354,153 | 10/1994 | Ottone . |
| 5,441,474 | 8/1995 | Morofuji . |
| 5,529,441 | 6/1996 | Kosmowski . |
| 5,573,230 * | 11/1996 | Lambertini ........................... 269/305 |
| 5,732,937 * | 3/1998 | Morghen .............................. 269/303 |
| 5,735,646 | 4/1998 | Finn . |
| 5,769,768 | 6/1998 | Polacek . |
| 5,785,307 * | 7/1998 | Chung .................................. 269/903 |
| 5,820,538 | 10/1998 | Watkinson . |
| 5,897,108 * | 4/1999 | Gordon et al. ....................... 269/903 |
| 5,915,678 * | 6/1999 | Slocum et al. ....................... 269/903 |
| 5,984,293 * | 11/1999 | Abrahamson et al. .............. 269/903 |

* cited by examiner

*Primary Examiner*—Joseph J. Hail, III
*Assistant Examiner*—Lee Wilson
(74) *Attorney, Agent, or Firm*—Knobbe, Martens, Olson & Bear, LLP

(57) ABSTRACT

A registration alignment system to be used with a printed circuit board drilling machine for registration of PCBs on the tooling plate for drilling and other operations. The registration alignment system includes a registration bar and a registration block that move independently of each other. The movement of the registration bar is constrained to one dimension (i.e., X-axis), and the movement of the registration block is constrained to one dimension (i.e., Y-axis) that is perpendicular to the axis of movement of the registration bar. The registration bar and block contact adjusting screws which are used to control precise movement of the registration bar and block. When the registration pins of the PCB are in position against the registration bar and block, the pins are held in place by clamping bars. When the size of the registration pins change, the registration of the new PCB is still correct and does not have to be adjusted.

17 Claims, 7 Drawing Sheets

MANUAL REGISTRATION PIN ALIGNMENT SYSTEM

BACKGROUND OF THE INVENTION

1. Field of the Invention

The field of this invention relates to registration devices used for positioning work pieces on a worktable and holding the same in place while the work piece is operated on. More particularly, this invention relates to registration devices that are attached to the tooling plate of the work tables of numeric controlled machine tools to register printed circuit boards and other work pieces for drilling or other machine operations.

2. Description of the Related Art

Printed Circuit Board (PCB) drilling machines are typically computer controlled machines having a table that moves in any X, Y plane, and a spindle that moves perpendicular to the table in the Z direction to drill holes in the PCB. One or more plates are mounted on the X, Y table, commonly called tooling plates, onto which stacks of one or more PCBs are placed. PCBs come in a variety of lengths, widths and thickness. However, PCBs always have at least two registration pins which are mounted in or through the PCB, so that the pins can be used to precisely mount the board into a known position after the board has been manually or automatically loaded onto the tooling plate. The tooling plate uses clamps and a registration bar, both of which are securely mounted on the plate, and are used to register the PCB with the drilling machine. The clamps are moving parts that are biased against the pins and hold the pins in place against the registration bar.

The registration pins are typically located at the center of two opposite edges of the PCB. In one common registration method as illustrated in FIGS. 8A and 8B, referred to as V-registration, the first registration pin 310 is held into place in a V-shaped registration block 125a at the end of a registration bar. The second pin 320, also referred to as the anti-rotation pin, is held against the registration bar by an elongated clamping bar (not shown). The registration block may be attached or separated from the registration bar. The V-shaped end of the registration bar is aligned to the drilling machine, so that the lead pin can be used as a starting dattuin for creating a drilling program for the PCB. The trailing pin is aligned with the lead pin, so that the centerline formed by the centers of the two registration pins is parallel with the registration bar.

The diameter of the registration pins is dependent on the thickness of the PCB. In use the V shaped clamping mechanism receives different diameter registration pins which occupy different positions within the V and maintain the same centers. However, different diameter pins create a problem, because different diameter registration pins can result in a misalignment of the registration pins and the anti-rotation pin leading to random registration errors. The first registration pin with the new diameter will still align its center properly in the V-shaped end of the registration bar because the V shape maintains axial alignment, but the trailing anti-rotation pin is aligned to the registration bar on one side thereof. Accordingly, the anti-rotation pin will extend away from the registration bar by its radius and not its axis, such that the centerline between the lead and trailing pins axes will be skewed so that the centerline is no longer parallel to the registration bar. The registration errors are detectable in the sub-micron level precision required for the accurate drilling of PCBs and holes will be drilled in the wrong locations.

In order to properly register the PCB with the drilling machine, the registration bar and in some cases the registration block needs to be adjusted in the tooling plate by moving in the X and Y dimension the registration block in the X and Y dimension so that the centerline formed by the two registration pins will be parallel to the registration bar. This adjustment must be made each time a different diameter registration pin is used. Because the tooling plate is heavy, and therefore difficult to move in the small distances that are required to calibrate the registration bar and the registration block with the drilling machine, a tedious, time-consuming manual alignment process that must occur whenever a PCB with a different registration pin size is loaded onto the drilling machine. If the registration block is attached to the end of the registration bar, alignment is even more difficult.

For the foregoing reasons, there is a need for a registration system that will eliminate the registration errors introduced by misalignment of the PCB when the registration pin size changes.

SUMMARY

The present invention is directed to registration devices that permit accurate registration of a PCB to a drilling machine without the need to recalibrate the registration surfaces each time a registration pin diameter change occurs. The registration alignment system of the instant invention comprises a tooling plate that has a channel and a registration bar and registration block that are mounted in the channel. The registration bar and registration block are each constrained to move in different directions. The registration bar moves along the X-axis and the registration block moves perpendicular to the X-axis, along the Y-axis. The registration bar and registration block are spaced apart so that they can be moved independently. There is at least one first adjustable mechanism for engaging and moving the registration bar. The adjusting mechanism is coupled to the registration bar such that it can be used to control precise movement of the registration bar. An adjusting screw is used for the first adjustable mechanism and the adjusting screw can be turned by hand or by tool. Once the registration bar is in the proper calibrated location, it is secured to the tooling plate by mounting screws. Similarly, there is at least one second adjustable mechanism for moving the registration block. This second adjustable mechanism is also coupled to the registration block such that it can be used to control precise movement of the registration block and is also an adjusting screw.

The object of this invention is to provide a convenient, simple, easy and accurate means for registration of a PCB on a machine that operates on the PCB.

This is extremely important in the context of machine drilling holes in PCBs, as very fine accuracy is required due to the high density of electrical components that are mounted on PCBs.

One feature of the present invention is the design of the registration block that accommodates any size diameter registration pin without the need for re-calibration.

Another feature of the present invention is the ability to move the registration bar and registration block independent of each other.

Still another feature of the present invention is the design of the adjusting mechanisms so that the registration bar and registration block can be easily moved in micro increments. In the present invention, the registration bar and registration block can be easily moved by hand in controlled, precise movements.

BRIEF DESCRIPTION OF THE DRAWINGS

The present invention will be described herein in conjunction with the appended drawing figures, wherein like numerals denote like elements, and.

DETAILED DESCRIPTION

The invention provides a manual registration pin alignment system for positioning printed circuit boards (PCB) and other work pieces for drilling or other machine operations. The invention could be used to position a variety of work pieces for drilling or other operations, but the invention is particularly suited for use in positioning PCBs for drilling. As a result, the preferred embodiment of the present invention is described in that context. It should be recognized, however, that such description is not intended as a limitation on the use or applicability of the present invention, but is instead provided merely to enable a full and complete description of a specific embodiment. Other implementations may be recognized by those skilled in the art upon review of this disclosure.

Figure 1:
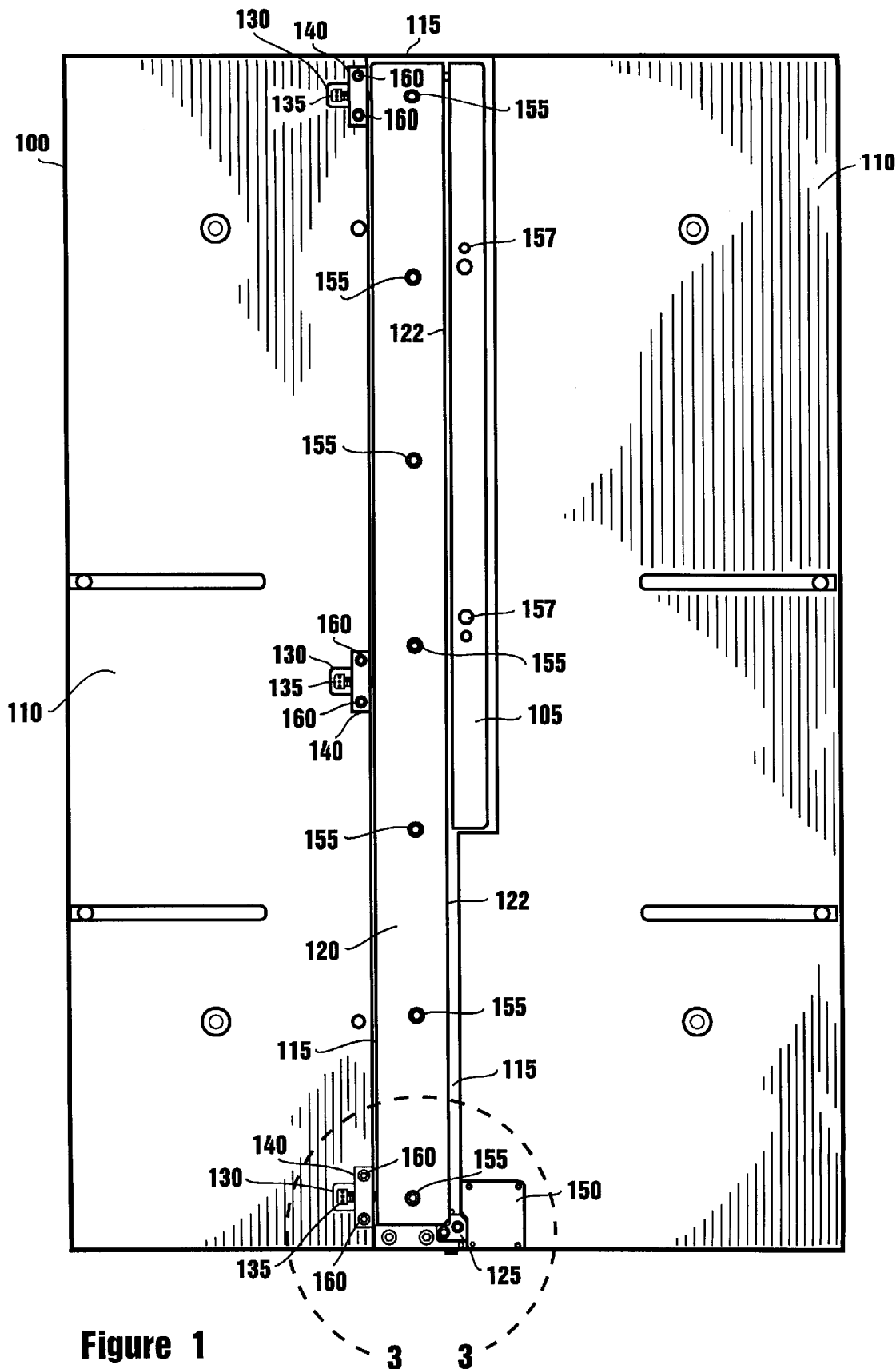
FIG. 1 is a top view of a manual registration pin alignment system according to the present invention.
Figure 2:
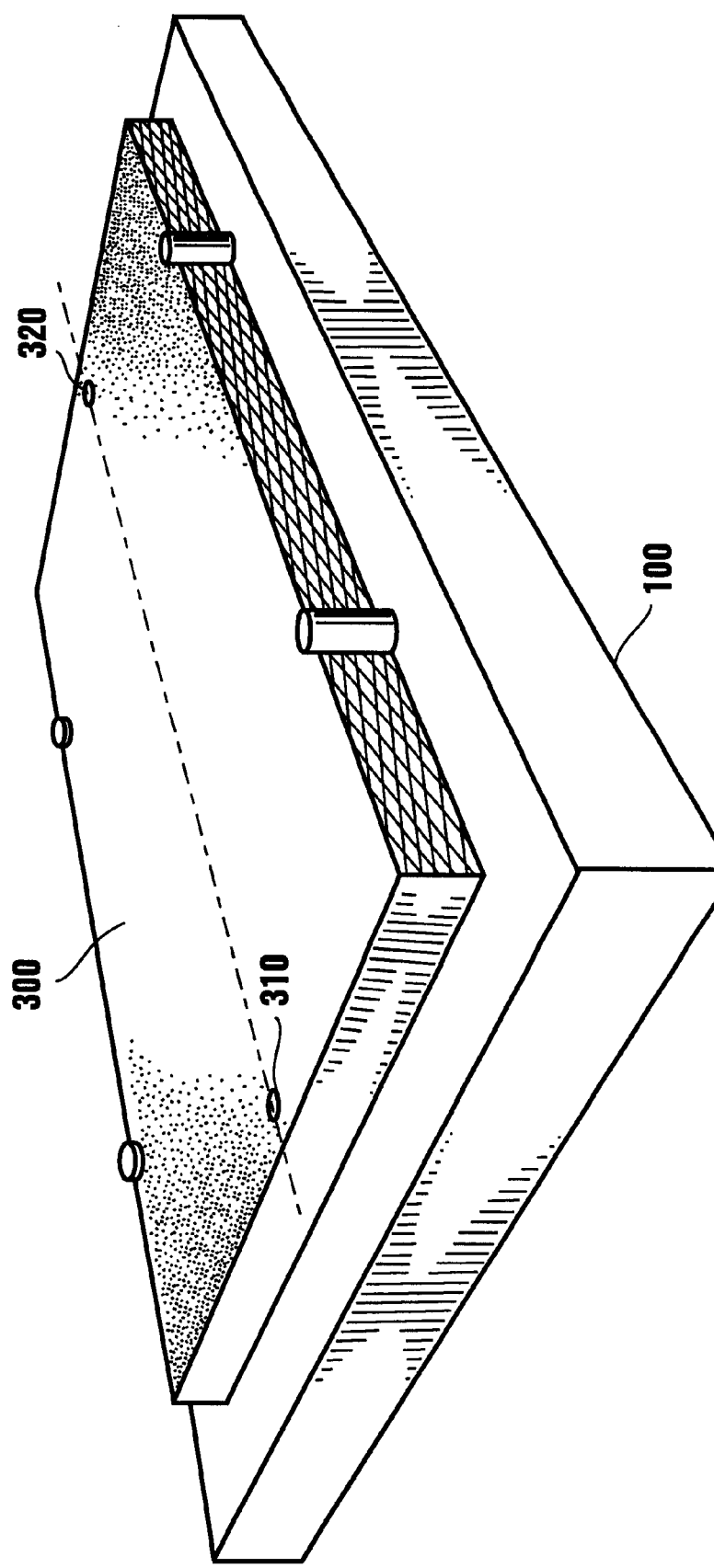
FIG. 2 illustrates a perspective view of a PCB with two registration pins.
Figure 3:
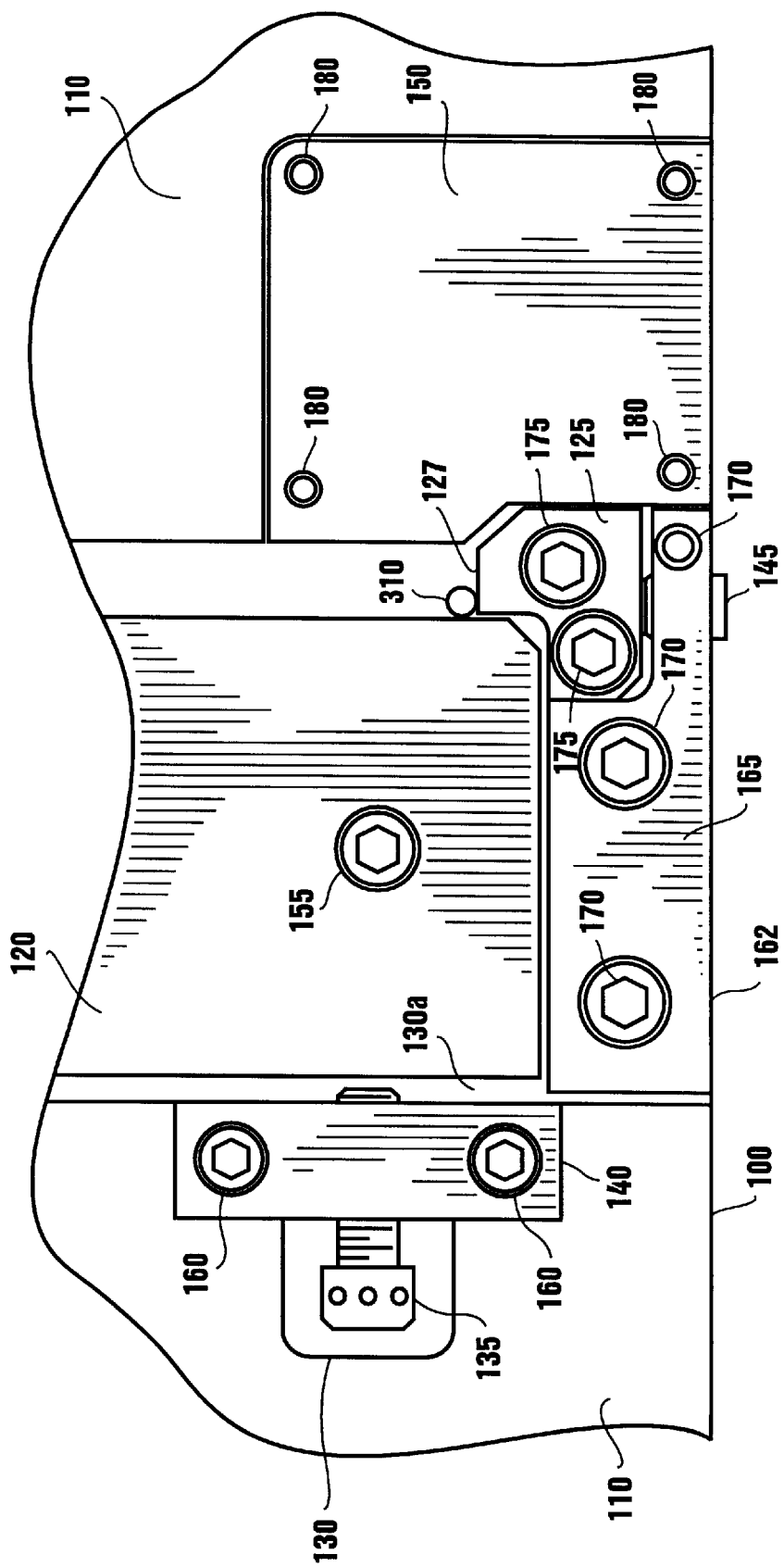
FIG. 3 is a detailed top view of part of the system of FIG. 1, depicting a registration pin in position for registration

FIG. 1 is a top view of a tooling plate 100 that is used to hold a PCB for machine drilling. Tooling plate 100, preferably fabricated from a light metal such as aluminum, has a work area 110 onto which the PCB is placed. A registration bar 120 is located in a channel 115 of the tooling plate such that the top surface of registration bar 120 is coplanar with, or below, work area 110, Similarly, a registration block 125 and a clamping bar 105 are located in channel 115, so that the top surfaces of registration block 125 and clamping bar 105 are also coplanar with, or below, work area 110. Registration block 125 is spaced away from registration bar 120 so that block 125 and registration bar 120 can each be moved independent of the other and thus may be separately calibrated.

referring now to FIG. 2, a PCB 300 is illustrated with first registration pin 310 and second registration pin 320 inserted therein. The registration pins are used to align the PCB 300 to tooling plate 100 of a machine tool (now shown). Registration pins 310 and 320 extend below the surface of PCB 300 to engage the channel 115. the PCB is manually loaded on tooling plate 100 so that registration pins 310 and 320 extend into channel 115 of the tooling plate to permit the PCB to lie flat on the tooling plate 100. As shown in FIG. 3, illustrating a top view of a portion of the tooling plate 100 from FIG. 1, first registration pin 310 (PCB is not shown) is positioned in place against registration block 125 and registration bar 120 by a clamping cam (not shown). Second registration pin 320 (not shown), also referred to as an anti-rotation pin, is held in place against registration bar 120 by clamping bar 105 (see FIG. 1). In this configuration, the PCB is held securely in place for drilling. The spindle (not shown) moves perpendicular to the tooling plate in at least the Z direction to drill holes in the entire tooling plate is moved in the plane to position the board or work piece for drilling Referring to FIG. 1, registration bar 120, preferably fabricated from stainless steel so as to better withstand changes in temperature, is mounted to tooling plate 100 by a plurality of mounting screws 155. Registration bar 120 preferably has an elongated straight edge 122 so that the registration pins can be biased against the registration bar at any position along the bar. Edge 122 is aligned to the machine calibration position to align the anti-rotation pin in a registration position known to the machine. Adjustment mechanisms 130 are positioned along the outer edge of registration bar 120 on the side opposite surface 122. The number of adjustment mechanisms may vaty, but in this specific embodiment preferably there are three such mechanisms 130 that are equidistantly spaced apart along the registration bar 120.

Each adjustment mechanism 130 is mounted such that its upper sluface is co-planar with, or below work area 110, so that the PCB can be positioned flat on the tooling plate. Refeiring to FIG. 3, adjustment mechanism 130 comprises a molunting block 140 fastened to adjacent channel 115 with fasteners 160, and an adjustment screw 135. Fasteners 160 may be rivets, screws, pins or the like. Moumting block 140 is securely attached to tooling plate 100 by the fasteners, and is held rigidly in place. Alternatively, the mounting block may be made integral with the tooling plate. Adjustment screw 135 extends through mounting block 140, so that the adjustment screw contacts the edge of registration bar 120 to effect the controlled movement of the registration bar, as will be described in more detail below. In this mainuer, registration bar 120 is coupled operatively to adjustment mechanisms 130. In the illustrated embodiment, there is a recess 130a in the tooling plate for receiving the adjustment mechanism 130. The recess provides sufficient clearance between adjustment mechanism 130 and the sides of the recess 130a to permit manipulation of the adjustment screw 135.

Referring to FIG. 1 clamping bar 105, preferably fabricated from stainless steel, is slidably mounted to tooling plate 100 by mounting screws 157. Clamping bar 105 is positioned so that its longitudinal axis is parallel to the longitudinal axis of registration bar 120. Clamping bar 105 is moveable across channel 115, toward and away from the registration bar. Clamping bar 105 clamps the anti-rotation pin 320 into place as described in more detail below.

Referring again to FIG. 3 registration block 125, preferably fabricated fiom stainless steel, is mounted to tooling plate 100 by at least one mounting screw 175. In the described embodiment two moumting screws 175 are shown. In the illustrated forming a block embodiment, registration block 125 is formed with a straight edge 127 registration suface for receiving registration pin 310 against the registration block at any position along the straight edge to accommodate registration pins of different diameters without the need to recalibrate the position of registration block 125. When registered, registration pin 310 is clamped into position against edge 127 and registration bar 120. Adjustment mechanism 162 is attached to the tooling plate adjacent to registration block 125 and is received in a recess 162a. Adjustment mechanism 162 is mounted such that it is co-planar with or below work area 110 so that the PCB to be worked can be positioned flat on the tooling plate. Adjustment mechanism 162 comprises a mounting block 165, a plurality of fasteners 170, and an adjustment screw 145. Fasteners 170 may be rivets, screws, pins or the like. Mounting block 165 is securely attached to tooling plate 100 by the fasteners, and thus is held rigidly in place. Alternatively, the mounting block may be made integral with the tooling plate. Adjustment screw 145 extends through mounting block 165, so that the adjustment screw contacts registration block 125 on a side opposite the straight edge 127 to effect the controlled movement of the registration block, as described in more detail below. In this manner, registration block is coupled operatively to adjustment mechanism 162. In the illustrated embodiment, there is a gap between registration bar 120 and registration block 125 so that the registration bar and the registration block can move independently. This gap is less than the radius of any registration pin 310.

A cover 150 is secured to the tooling plate by fasteners 180. Cover 150 is easily removed so that there is access to the registration block cam 200 beneath the surface of the tooling plate.

Figure 4:
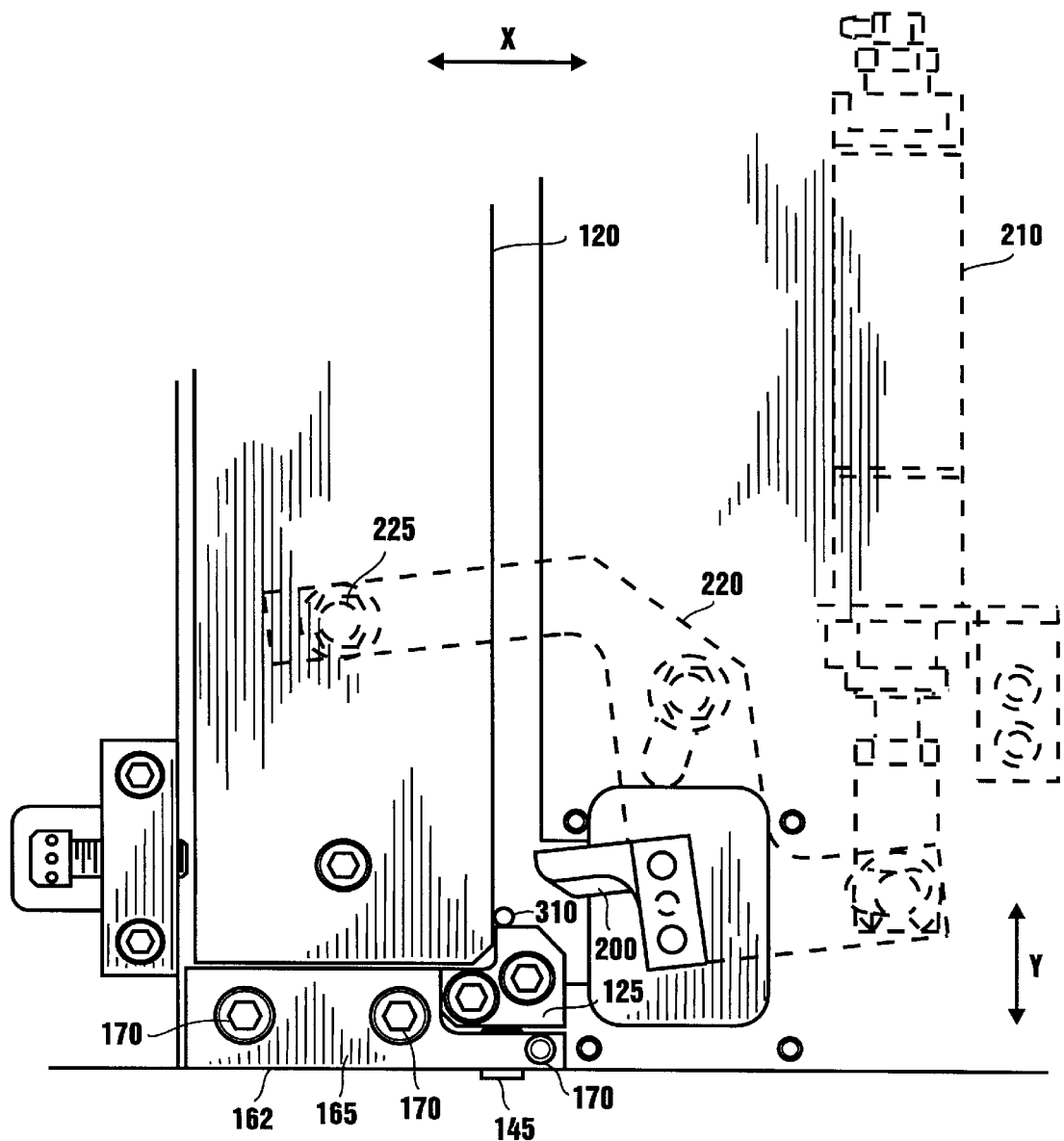
FIG. 4 is a close up view of the clamping mechanism in an open position including the operating activator.
Figure 5:
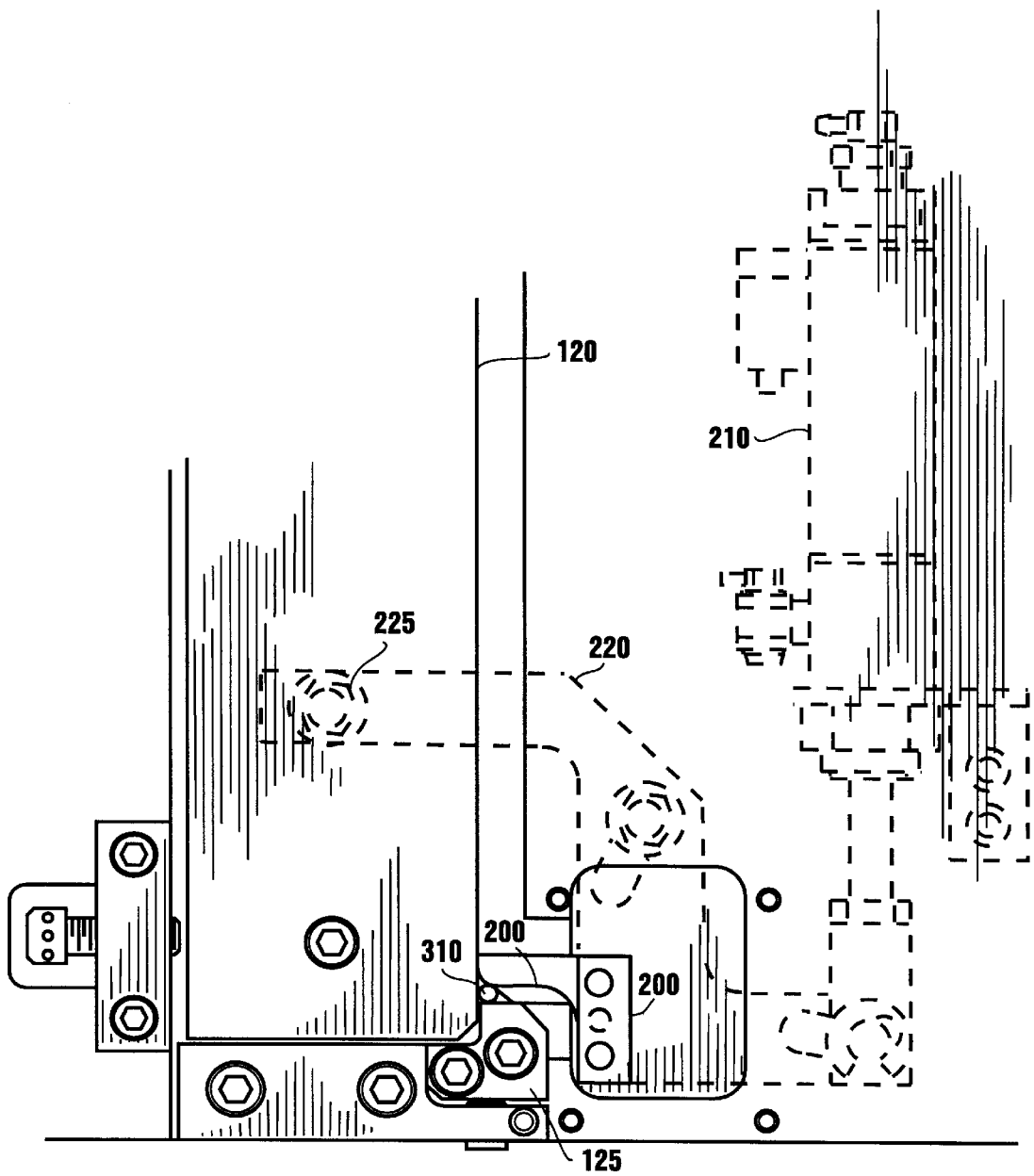
FIG. 5 is a close up view of the clamping mechanism in a closed position including the operating activator.
Figure 6:
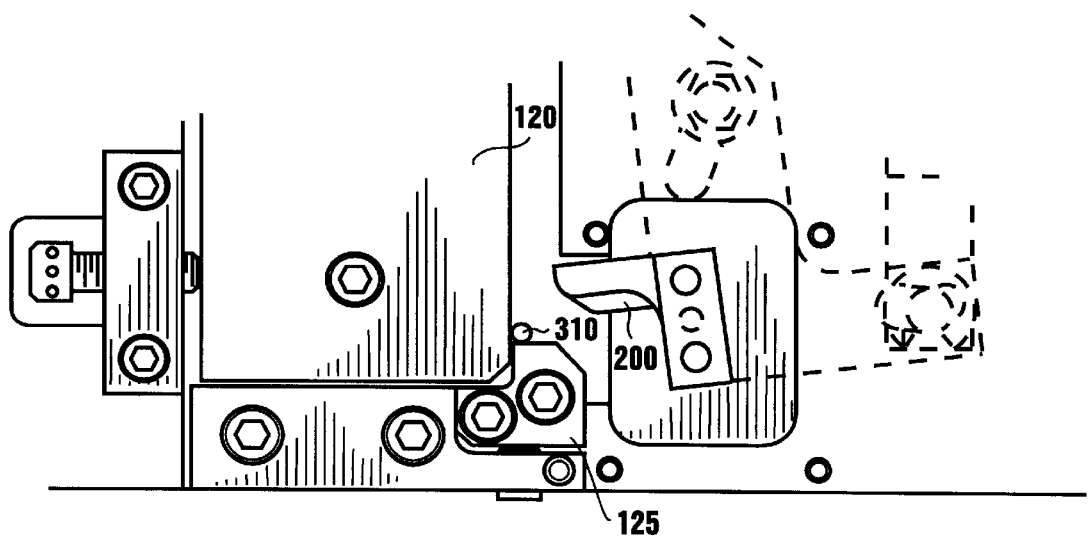
FIG. 6 is a view of registration pin and clamping cam.
Figure 7:
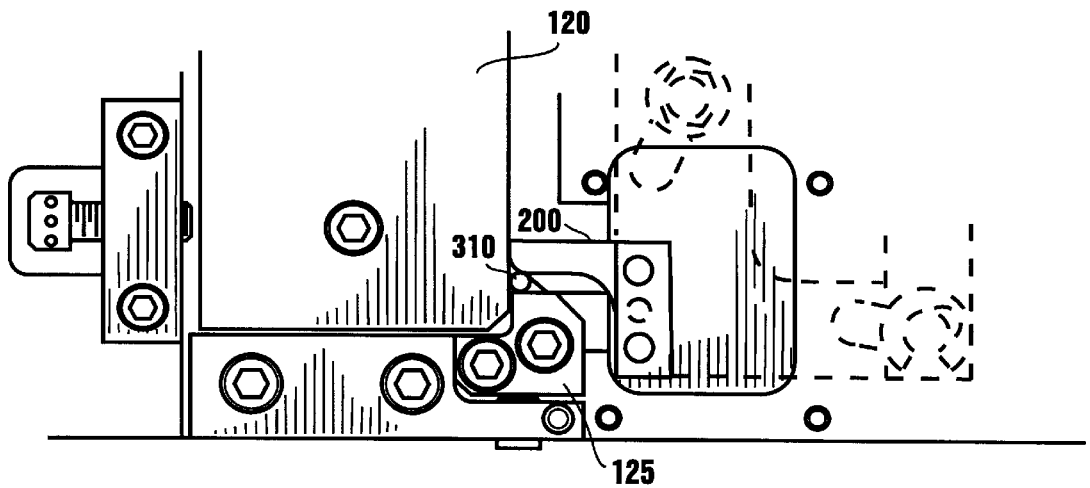
FIG. 7 is a view of registration pin in registration position engaged by clamping cam.
Figure 8A:
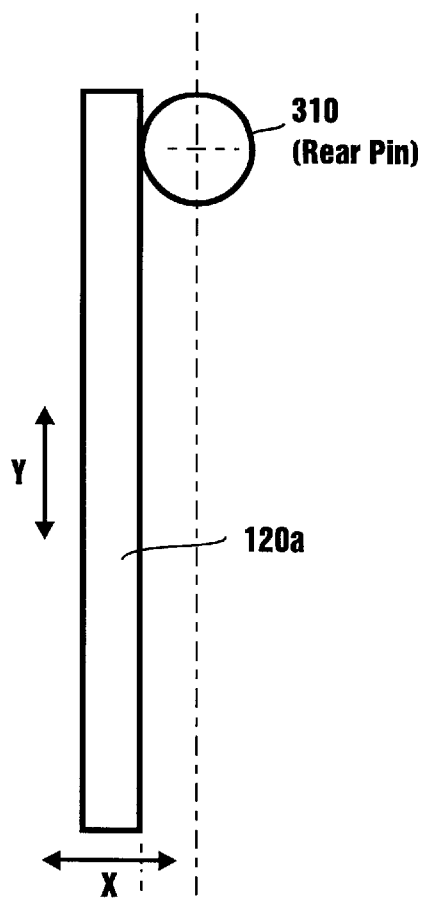
FIGS. 8A and 8B are views of the prior art device.
Figure 8B:
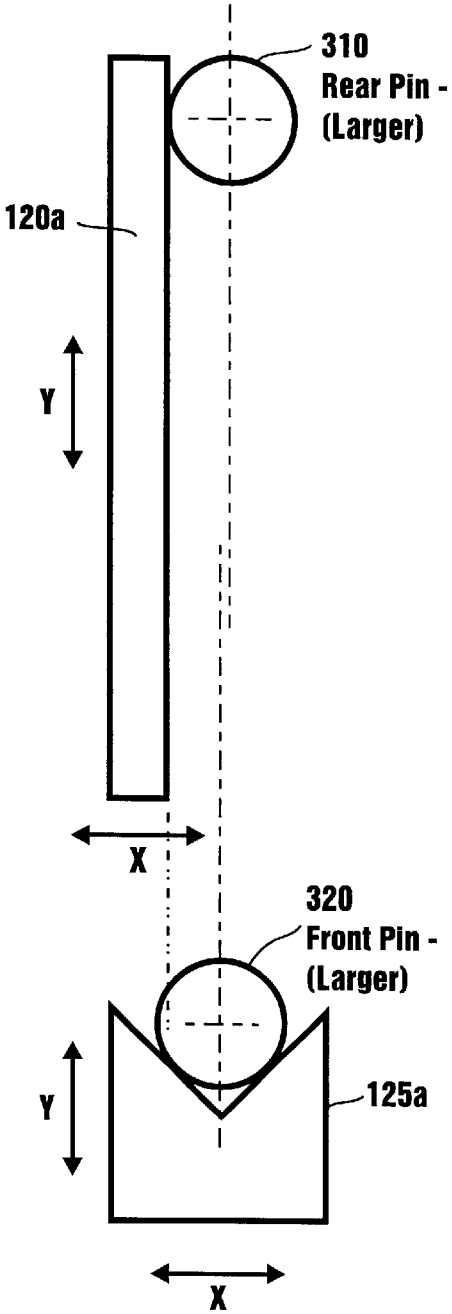

Referring now to FIG. 4 registration pin 310 is positioned adjacent to registration bar 120 and registration block 125. A registration cam 200 is moved away fiom registration pin 310 to allow it to be manually positioned in the channel adjacent the registration block 125. A pneumatic or other actuator 210 is coupled to cam 200 through a link 220 shown as a dotted line. The link pivots about a pivot point 225 on actuation of the actuator 220 as shown in FIG. 5 and clamps the registration pin 310 against the registration block 125 and the registration bar 120 as illustrated in FIG. 5 thus holding registration pin 310 into a registration position. A similar actuating mechanism (not shown) known in the art clamps the anti-rotation pin 320 against the registration bar 120 to hold both the registration pin 310 and the anti-rotation pin 320 in a known alignment in registration with the tooling plate. FIGS. 6 and 7 are detailed close-up views of the registration pin cam 200 in the open and in the closed position showing the mamuer of engagement with registration pin 310.

Operation of the registration pin alignment system is as follows. Wien a PCB is loaded onto the drilling machine, the PCB or work piece is registered by using the location of the first registration pin 310 as the starting datum. First registration pin 310 is biased by the clamping cam 200 against registration block 125 and registration bar 120. The zero registration point is adjusted by moving the registration block and registration bar. Registration bar 120 and registration block 125 can each be moved independently due to the clearance between registration bar 110 and registration block 125. Movement of the registration block is restricted to one axis (i.e., the Y-axis). Similarly, movement of the registration bar is restricted to an axis that is perpendicular (i.e., the X-axis) to the axis of movement for the registration block.

The position of registration block 125 and registration bar 120 is adjusted as follows. Block 115 and bar 120 can be adjusted in any order. Referring again to FIG. 3, registration block 125 is moved by tulning adjustment screw 145. Adjustment screw 145 extends through mounting block 165 and contacts registration block 125 for the controlled movement of the registration block. Turning adjustment screw 145 in one direction will cause the adjustment screw to move into contact with registration block 125. Consequently, registration block 125 will move in one direction along the Y-axis. Turning adjustment screw 145 in the other direction will move the adjustment screw away from registration block 125, thus enabling the registration block to be moved in the opposite direction along the Y-axis as is known in the art. Once the registration bar 120 has been properly positioned, adjustment screws 135 may be moved away from the registration bar 120. The adjustment screw can be turned in small, controlled movements, so that the registration block can be positioned precisely to sub-micron accuracy. Once registration block 125 is in the correct position for proper registration of the machine drill, then the position of the registration block can be fixed on tooling plate 100 by tirning mounting screws 175 and thus holding the registration block rigidly in place.

Registration bar 120 is adjusted in a similar manner. Refeting back to FIG. 1, registration bar 120 is moved by turning adjustment screws 135. Each adjustment screw 135 extends through mounting block 140 and contacts registration bar 120 for the controlled movement of the registration bar. Turning adjustment screws 135 in one direction will cause the adjustment screws to move into contact with registration bar 120. Consequently, registration bar 120 will move in one direction along the X-axis. Turning adjustment screws 135 in the other direction will move the adjustment screws away from registration bar 120, thus enabling the registration bar to be moved in the opposite direction along the X axis as known in the art. Once the registration bar 120 has been properly positioned, adjustment screws 135 may be moved away from the registration bar 120. The adjustment screws can be turned in small, controlled movements, so that the registration bar can be positioned precisely to sub-micron accuracy. Once registration bar 120 is in the correct position for proper registration of the machine drill, then the position of the registration bar can be fixed on tooling plate 100 by turning mounting screws 155 and thus holding the registration bar rigidly in place.

When PCB 300 is located onto tooling plate, registration pins 310 and 320 are mounted into holes in the PCB as illustrated in FIG. 2. The PCB is placed on the tooling plate so that the registration pins extend into channel 115 of the tooling plate adjacent to the registration bar 120 and registration block 125. First registration pin 310 is placed against registration block 125 and registration bar 120 so that the pin is in the corner of the right angle formed by the registration block 125 and the registration bar 120. Second registration pin 320 is placed against registration bar 120. Trailing registration pin 320 is held in place against registration bar 120 by clamping bar 105. Lead registration pin 310 is held in place against registration block 125 and registration bar 120 by clamping cam 200. In this manner, the PCB is held securely in place at a known registration location so that accurate drilling or other machine operations can take place on the PCB.

While a specific embodiment of this invention has been described in detail above, those skilled in the art will readily appreciate that many modifications are possible in the specific embodiment, without materially departing from the novel teachings and advantages of this invention. For example, the registration block and registration bar could be made integral. Accordingly, all such modifications are intended to be included within the scope of this invention, as defined in the following claims.

The embodiments of the invention in which an exclusive property or privilege is claimed are defined as follow:

1. A registration alignment system for use with a machine tool comprising:
   a. a tooling plate having a channel;
   b. a registration block having a first registration surface, said registration block received in said channel, said registration block mounted in said channel for selective movement in at least one first direction;

c. a registration bar having a second registration surface received in said channel, spaced apart from said registration block and mounted in said channel for selective movement in at least one second direction;

d. said first and second registration surfaces forming a registration location;

e. at least one first adjusting mechanism for adjustably positioning said registration block, mounted on said tooling plate; and f. at least one second adjusting mechanism for adjustably positioning said registration bar, mounted on said tooling plate.

2. A registration alignment system as described in claim 1, wherein there are a plurality of second adjusting mechanism for adjustably positioning said registration bar, spaced apart along said registration bar.

3. A registration alignment system as described in claim 1 wherein said second registration surface is a straight edge.

4. A registration alignment system for a machine tool comprising:

a. a tooling plate having a channel;

b. a registration bar received in said channel adapted for movement within said channel in at least one direction;

c. a registration block received in one end of said channel spaced apart from said registration bar, said registration block moveably mounted for adjustable positioning in a direction generally perpendicular to the movement of said registration bar;

d. at least one first adjusting screw mounted on said tooling plate operatively coupled to said registration block for selectively moving said registration block; and e. at least one second adjusting screw mounted on said tooling plate operatively coupled to said registration bar for selectively moving said registration bar for adjustment.

5. A registration pin alignment and clamping system for a machine tool comprising:

a. a tooling plate having a channel;

b. a registration block having a first registration surface, said registration block received in said channel and mounted in said channel for selective movement in at least one first direction;

c. a registration bar having a second registration surface received in said channel, spaced apart from said registration block, and mounted in said channel for selective movement in at least one second direction;

d. said first and second registration surfaces forming a registration location;

e. at least one first adjusting mechanism engaging and adjustably positioning said registration bar;

f. at least one second adjusting mechanism engaging and adjustably positioning said registration block;

g. a first clamping mechanism for clamping a first registration pin against said first and second registration surfaces in said registration location; and h. a second clamping mechanism for clamping a second registration pin against said first registration surface.

6. A registration alignment and clamping system as described in claim 5, wherein there are a plurality of adjusting mechanism for adjustably positioning said registration bar, spaced apart along said registration bar.

7. A registration alignment and clamping system as described in claim 5, wherein said second registration surface is a straight edge.

8. A registration alignment system for a machine tool comprising:

a. a tooling plate having a channel;

b. a registration block received in one end of said channel and moveably mounted for adjustable positioning in at least one first direction;

c. a registration bar received in said channel, spaced apart from said registration bar, and moveable within said channel in at least one direction generally perpendicular to movement of said registration bar;

d. at least one adjusting screw mounted on said tooling plate operatively coupled to said registration bar for selectively moving said registration bar for adjustment; and e. at least one adjusting screw mounted on said tooling plate operatively coupled to said registration block for selectively moving said registration block.

9. A registration alignment system for use with a machine tool comprising:

a. a tooling plate having a channel;

b. a registration block having a first registration surface, said registration block received in said channel spaced apart from said registration bar, said registration block mounted in said channel for selective movement in at least one second direction;

c. a registration bar having a second registration surface received in said channel and mounted in said channel for selective movement in at least one second direction;

d. said first and second registration surfaces forming a registration location;

e. at least one adjusting mechanism for adjustably positioning said registration block; and f. at least one adjusting mechanism for adjustably positioning said registration bar.

10. A registration alignment system as described in claim 9, wherein there are a plurality of adjusting mechanism for adjustably positioning said registration bar, spaced apart along said registration bar.

11. A registration alignment system as described in claim 9, wherein said second registration surface is a straight edge.

12. A registration alignment system for use with a machine tool comprising:

a. a tooling plate having a channel;

b. a registration block received in said channel and moveably mounted for adjustable;

c. a registration bar received in said channel, spaced apart from said registration block and adapted for movement within said channel in a direction generally perpendicular to the movement of said registration block in at least one direction;

d. at least one first adjusting screw mounted on said tooling plate operatively coupled to said registration block for selectively moving said registration block;

e. at least one second adjusting screw mounted on said tooling plate operatively coupled to said registration bar for selectively moving said registration bar;

f. at least one first fastener for selectively fastening said registration block into a fixed position; and g. at least one second fastener for selectively fastening said registration bar into a fixed position.

13. A registration alignment and clamping system for use with a machine tool comprising:

a. a tooling plate having a channel;

b. a registration block having a first registration surface, said registration block adjustably received in said channel and mounted in said channel for selective movement in at least one first direction;

c. a registration bar having a second registration surface, spaced apart from said registration block adjustably received in said channel for selective movement in at least one second direction;

d. said first and second registration surfaces forming a registration location;

e. at least one first adjusting mechanism for adjustably positioning said registration block, mounted on said tooling plate;

f. at least one second adjusting mechanism for adjustably positioning said registration bar, mounted on said tooling plate;

g. at least one first fastener for selectively fastening said registration block into a fixed position; and h. at least one second fastener for selectively fastening said registration bar into a fixed position.

14. A registration alignment system as described in claim 13, wherein there are a plurality of second adjusting mechanism for adjustably positioning said registration bar, spaced apart along said registration bar.

15. A registration alignment system as described in claim 13, wherein said second registration surface is a straight edge.

16. A registration alignment system for use with a machine tool comprising:

a. a tooling plate having a channel;

b. at least one registration block received in said channel, moveably mounted for adjustable positioning in at least one first direction;

c. at least one registration bar received in said channel spaced apart from said registration block and moveable within said channel in at least one direction generally perpendicular to movement of said registration block;

d. at least one first adjusting screw mounted on said tooling plate operatively coupled to said registration block for selectively moving said registration block for adjustment;

e. at least one second adjusting screw mounted on said tooling plate operatively coupled to said registration bar for selectively moving said registration bar;

f. at least one first fastener for selectively fastening said registration block into a fixed position; and g. at least one second fastener for selectively fastening said registration bar into a fixed position.

17. A registration alignment system for use with a machine tool comprising:

a. a tooling plate having a channel;

b. a registration block having a first registration surface, said registration block received in said channel, said registration block mounted in said channel for selective movement in at least one first direction;

c. a registration bar having a second registration surface comprising a straight edge, received in said channel, spaced apart from said registration block and mounted in said channel for selective movement in at least one second direction;

d. said first and second registration surfaces forming a registration location;

e. at least one first adjusting mechanism for adjustably positioning said registration block, mounted on said tooling plate; and f. at least one second adjusting mechanism for adjustably positioning said registration bar, mounted on said tooling plate.

* * * * *